United States Patent [19]

Gillingham

[11] Patent Number: 5,712,823
[45] Date of Patent: Jan. 27, 1998

[54] FLEXIBLE DRAM ARRAY

[75] Inventor: Peter B. Gillingham, Kanata, Canada

[73] Assignee: Mosaid Technologies Incorporated, Kanata, Canada

[21] Appl. No.: 597,510

[22] Filed: Feb. 2, 1996

Related U.S. Application Data

[62] Division of Ser. No. 355,957, Dec. 14, 1994.

[51] Int. Cl.$^6$ ............................................... G11C 7/00
[52] U.S. Cl. ............... 365/203; 365/189.01; 365/230.06; 365/189.11
[58] Field of Search ................. 365/230.06, 230.08, 365/238.5, 203, 189.01, 189.11, 185.33, 185.23, 185.28

[56] References Cited

U.S. PATENT DOCUMENTS

| | | | |
|---|---|---|---|
| 4,954,994 | 9/1990 | Hashimoto | 365/230.06 |
| 5,003,510 | 3/1991 | Kamisaki | 365/189.05 |
| 5,202,855 | 4/1993 | Morton | 365/189.11 |
| 5,214,602 | 5/1993 | Lines | 365/189.11 |
| 5,267,201 | 11/1993 | Foss et al. | 365/189.09 |
| 5,297,104 | 3/1994 | Nakashima | 365/204 |
| 5,319,606 | 6/1994 | Bowen et al. | 365/230.03 |
| 5,367,655 | 11/1994 | Grossman et al. | 365/230.06 |
| 5,373,479 | 12/1994 | Noda | 365/189.11 |
| 5,404,330 | 4/1995 | Lee et al. | 365/189.11 |
| 5,412,331 | 5/1995 | Jun et al. | 365/230.06 |
| 5,428,577 | 6/1995 | Yumitori et al. | 365/230.06 |
| 5,568,436 | 10/1996 | Furuyama | 365/230.03 |

*Primary Examiner*—Tan T. Nguyen
*Attorney, Agent, or Firm*—Pascal & Associates

[57] ABSTRACT

A DRAM array comprised of plural wordlines and plural bitlines, bit charge storage capacitors associated with the bitlines and wordlines, cell access field effect transistors (FETs) having their gates connected to the wordlines and their source-drain circuits connected between the bitlines and the charge storage cells, for enabling reading or writing data from or to the charge storage capacitors, and programmable addressing apparatus for causing the wordlines, once addressed, to selectively enable either one or more than one cell access FET, whereby data can be selectively read from or written to one or more than one charge storage capacitor.

10 Claims, 8 Drawing Sheets

TABLE 1

| | INPUT | | | | RESULTING OUTPUT | | | |
|---|---|---|---|---|---|---|---|---|
| | $AX_i$ | $\overline{AX_i}$ | $AX_j$ | $\overline{AX_j}$ | $AX_{ij}(0)$ | $AX_{ij}(1)$ | $AX_{ij}(2)$ | $AX_{ij}(3)$ |
| ACTIVE | 0 | 1 | 0 | 1 | 1 | 0 | 0 | 0 |
| | 1 | 0 | 0 | 1 | 0 | 1 | 0 | 0 |
| | 0 | 1 | 1 | 0 | 0 | 0 | 1 | 0 |
| | 1 | 0 | 1 | 0 | 0 | 0 | 0 | 1 |
| STANDBY | 0 | 0 | 0 | 0 | 0 | 0 | 0 | 0 |

FIG. 4

TABLE 2

| | $AX_1$ | $\overline{AX_1}$ | $AX_{01}(0)$ | $AX_{01}(1)$ | $AX_{01}(2)$ | $AX_{01}(3)$ |
|---|---|---|---|---|---|---|
| ACTIVE | 0 | 1 | 1 | 1 | 0 | 0 |
| | 1 | 0 | 0 | 0 | 1 | 1 |
| STANDBY | 0 | 0 | 0 | 0 | 0 | 0 |

FIG. 5

FLEXIBLE DRAM ARRAY

This is a divisional of application Ser. No. 08/355,957, filed Dec. 14, 1994 pending.

FIELD OF THE INVENTION

The invention relates to the field of semiconductor memories, and in particular to dynamic random access memories (DRAM).

BACKGROUND TO THE INVENTION

DRAM arrays are memories comprised of memory cells, wordlines and bitlines, the latter lying orthogonal to the wordlines, the memory cells being located adjacent crossovers of the wordlines and bitlines. Each of the memory cells is typically comprised of an n channel capacitor in series with the source-drain circuit of an n channel access field effect transistor (FET), the gate of which is connected to and is enabled by an associated wordline. This form of cell is referred to as a 2T cell.

A bit of a particular logic level, sensed in a bit line sense amplifier, is stored in each cell. Prior to reading from or writing to a cell, both the bit line and word line are precharged. The bit line is typically precharged to a voltage Vdd/2, and the word line is precharged to Vss, to completely isolate the memory cell capacitor from the bitline.

Because many DRAM production processes are not optimized, cell leakage often occurs, and data retention may not be adequate for some applications. To achieve superior data retention, data can be stored differentially in two individual cells. Each bit is stored as a '0' in one cell and as a '1' in another cell. Leakage will degrade a '1' level in an n-channel cell array, but not a '0'. While common mode disturbances do not affect stored data in this case, thus improving data retention, this reduces the capacity of the DRAM by half.

Some DRAMs also suffer from poor logic "1" voltage levels using the unboosted wordline active voltage Vdd. In this case, a logic "1" voltage level stored would be limited to Vdd–Vtn, where Vtn is the conduction threshold voltage of the cell access FET. In order to achieve better data retention in the DRAM cell the gate of the cell access FET can be driven to Vpp=Vdd+Vtn.

However, there is a significant question of whether a submicron manufacturing process can produce DRAMS which can withstand continuous voltage stress of Vpp, especially under worst case operating conditions.

SUMMARY OF THE INVENTION

The present invention is a DRAM array which can be programmed to provide for none, either or both, of storage of data bits in plural cells, and separate or simultaneous use of either unboosted or boosted wordline voltage. In this manner the DRAM can be operated for any or all of maximum storage, maximum cell bit retention and maximum reliability.

The following chart illustrates the tradeoffs, shown at the intersection of the columns and rows, which the designer is afforded for the first time in a single DRAM using the present invention. The tradeoffs being selectable by programming, allows the same DRAM to be used in various applications in which different conditions exist. For example, if the DRAM is to be used in a particular application such voice or image storage, data integrity is not so important since a lost bit would go substantially unnoticed.

In that case the maximum DRAM size might be desired, for which the application program could cause the DRAM to be programmed. The same DRAM could be programmed for other applications for maximum data integrity.

TABLE A

|  | 1 cell/bit | 2 cells/bit |
|---|---|---|
| Vpp enabled | dense storage<br>good cell margin<br>possible reliability problem | adequate storage<br>excellent margin<br>possible reliability problem |
| Vpp disabled | dense storage<br>possible cell retention problem<br>low stress | adequate storage<br>good cell margin<br>low stress |

In accordance with an embodiment of the invention, a DRAM array is comprised of plural wordlines and plural bitlines, bit charge storage capacitors associated with the bitlines and wordlines, cell access field effect transistors (FETs) having their gates connected to the wordlines and their source-drain circuits connected between the bitlines and the charge storage cells, for enabling reading or writing data from or to the charge storage capacitors, and programmable addressing apparatus for causing the wordlines, once addressed, to selectively enable either one or more than one cell access FET, whereby data can be selectively read from or written to one or more than one charge storage capacitor.

In accordance with another embodiment, a method of storing data in a DRAM is comprised of programming the DRAM as to whether each bit should be stored in one cell or in complementary form in a pair of cells of the DRAM, applying a plurality of bits to bitlines of the DRAM, and storing each of the bits in one or said plural cells depending on the programming.

In accordance with another embodiment, a DRAM array is comprised of plural wordlines and plural bitlines, bit charge storage capacitors associated with the bitlines and wordlines, and cell access field effect transistors (FETs) having their gates connected to the wordlines and their source-drain circuits connected between the bitlines and the charge storage cells, for enabling reading or writing data from or to the charge storage capacitors, a boosted wordline voltage source, and apparatus for selectably connecting the boosted voltage source or an unboosted voltage source to the wordlines, whereby said DRAM array can be operated selectably with or without a boosted wordline precharge voltage.

In accordance with another embodiment, a method of storing data in a DRAM array is comprised of providing an unboosted wordline voltage Vdd and a boosted wordline voltage Vpp and selectably programming application of either of the voltages to a wordline for reading or writing of a bit to a charge storage cell associated with the wordline.

BRIEF INTRODUCTION TO THE DRAWINGS

A better understanding of the invention will be obtained by reading the description of the invention below, with reference to the following drawings, in which:

FIG. 4 is a truth table of a NAND gate array in a predecoder of an embodiment of the invention, FIG. 5 is a truth table of the first stage of the predecoder of an embodiment of the invention.

Figure 7:
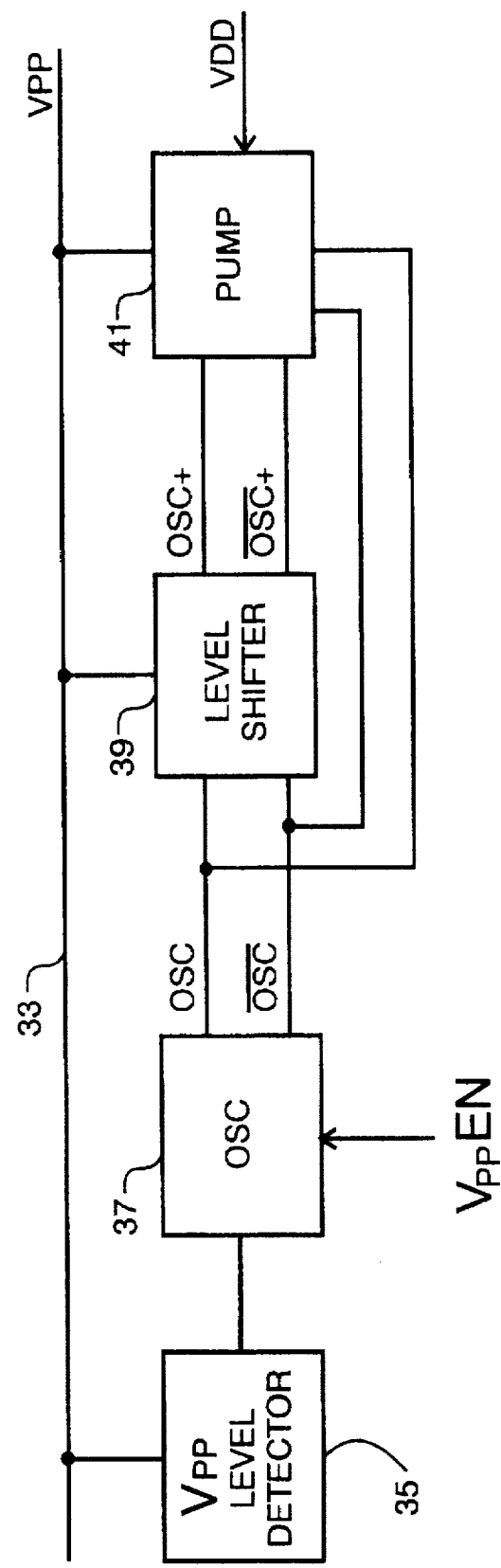
FIG. 7 is a block diagram illustrating another embodiment of the invention.
Figure 8:
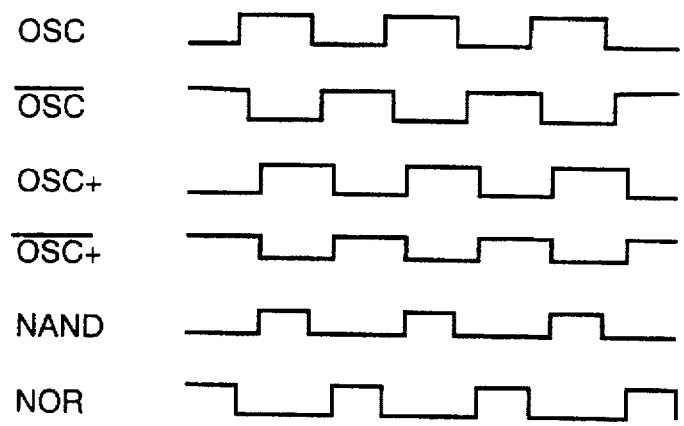
Figure 9:
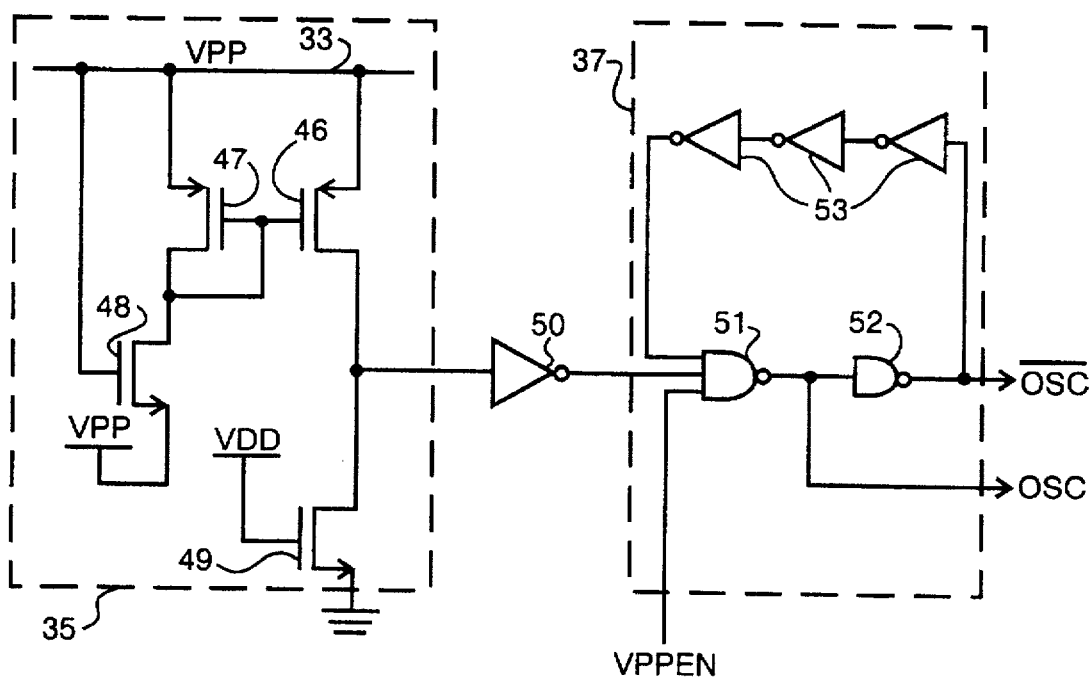
Figure 10:
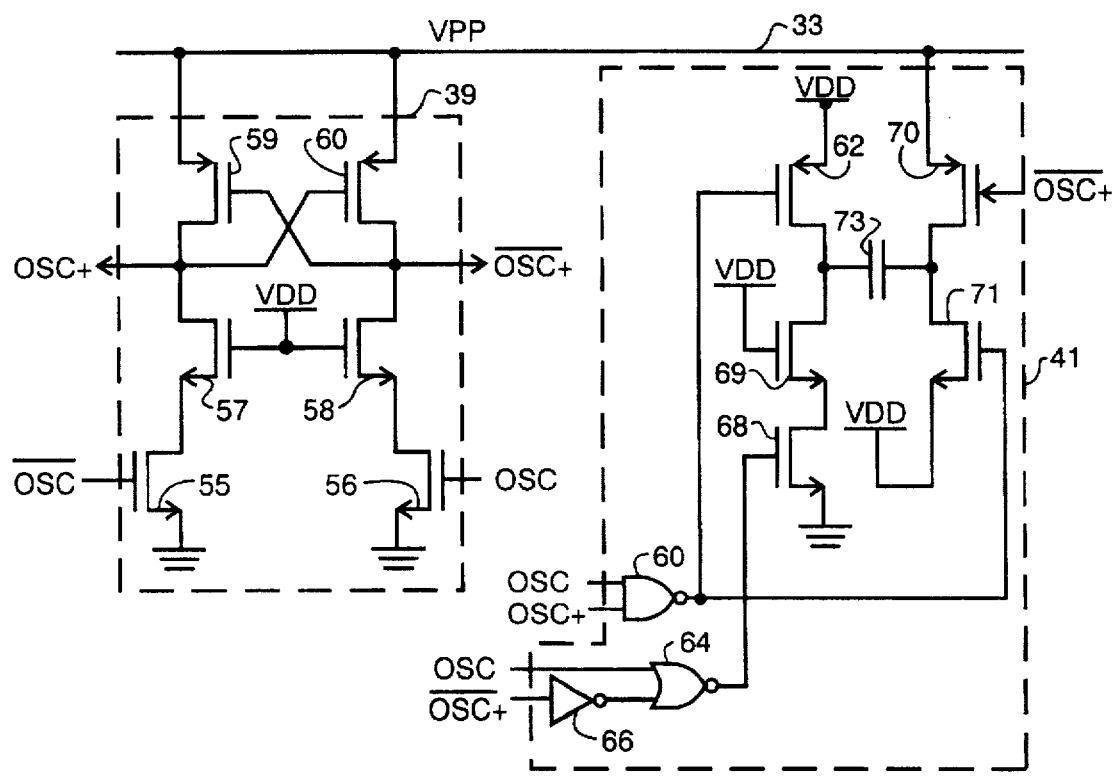
Figure 11:
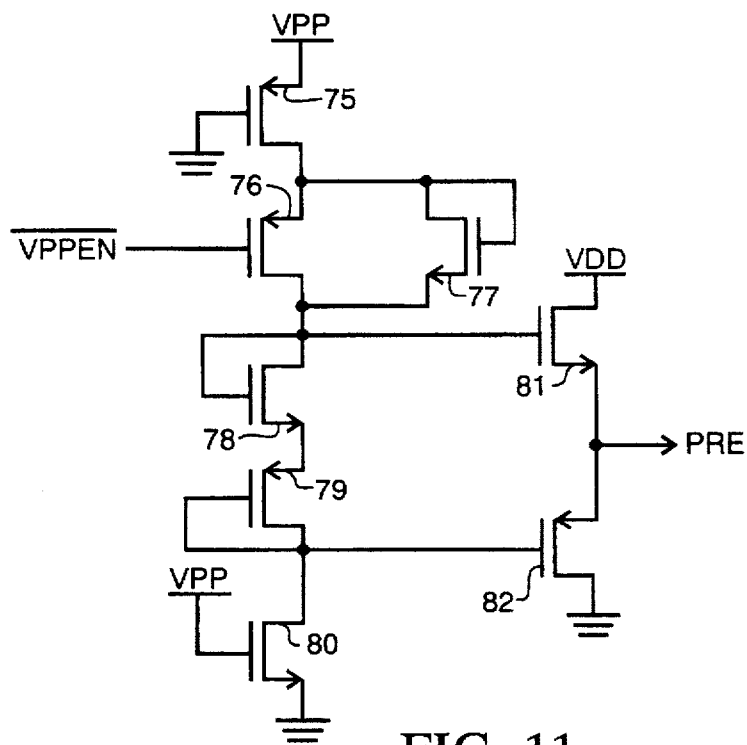
Figure 12:
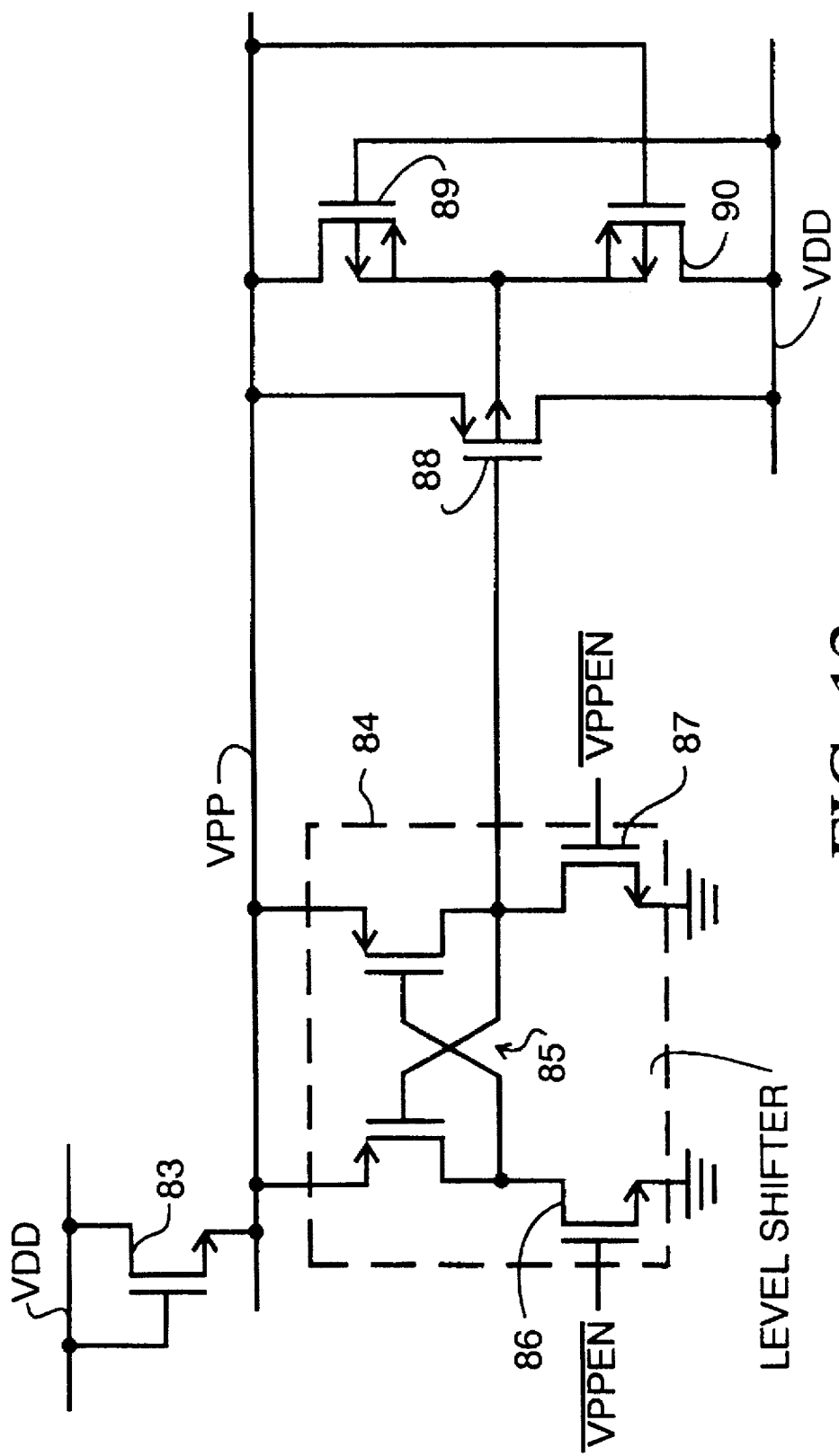

FIG. 8 is a timing diagram of various signals found in the embodiment of FIG. 7 and later figures, FIG. 9 is a schematic diagram of the level detector and oscillator of FIG. 7, FIG. 10 is a schematic diagram of the level shifter and pump of FIG. 7, FIG. 11 is a schematic diagram of a bit line precharge circuit that can be used with the embodiment of FIG. 7, and FIG. 12 is a schematic diagram of a circuit that ties the Vpp line to the voltage Vdd when the pump is disabled.

DETAILED DESCRIPTION OF THE INVENTION

Figure 1:
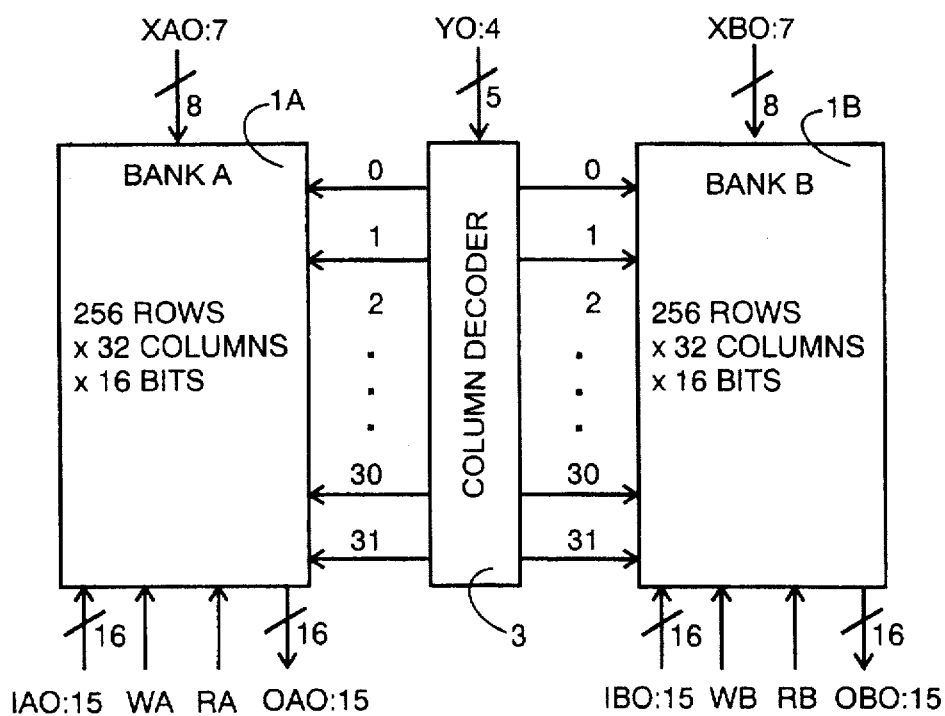
FIG. 1 is a block diagram of a DRAM as may be used in the present invention.

Turning to FIG. 1, a pair of DRAM memory banks 1A and 1B, also labeled Bank A and Bank B, are addressed via wordline address lines XA0:7 and XB0:7 respectively. Bit-lines of the DRAM are addressed by column address lines Y0:4 which are decoded in column decoder 3. The DRAM is of conventional construction, having either open or folded bitline construction. Each of the memory banks in the example shown in FIG. 1 has 256 rows by 32 columns by 16 bits, i.e. an 8192×32 bit memory.

Figure 2:
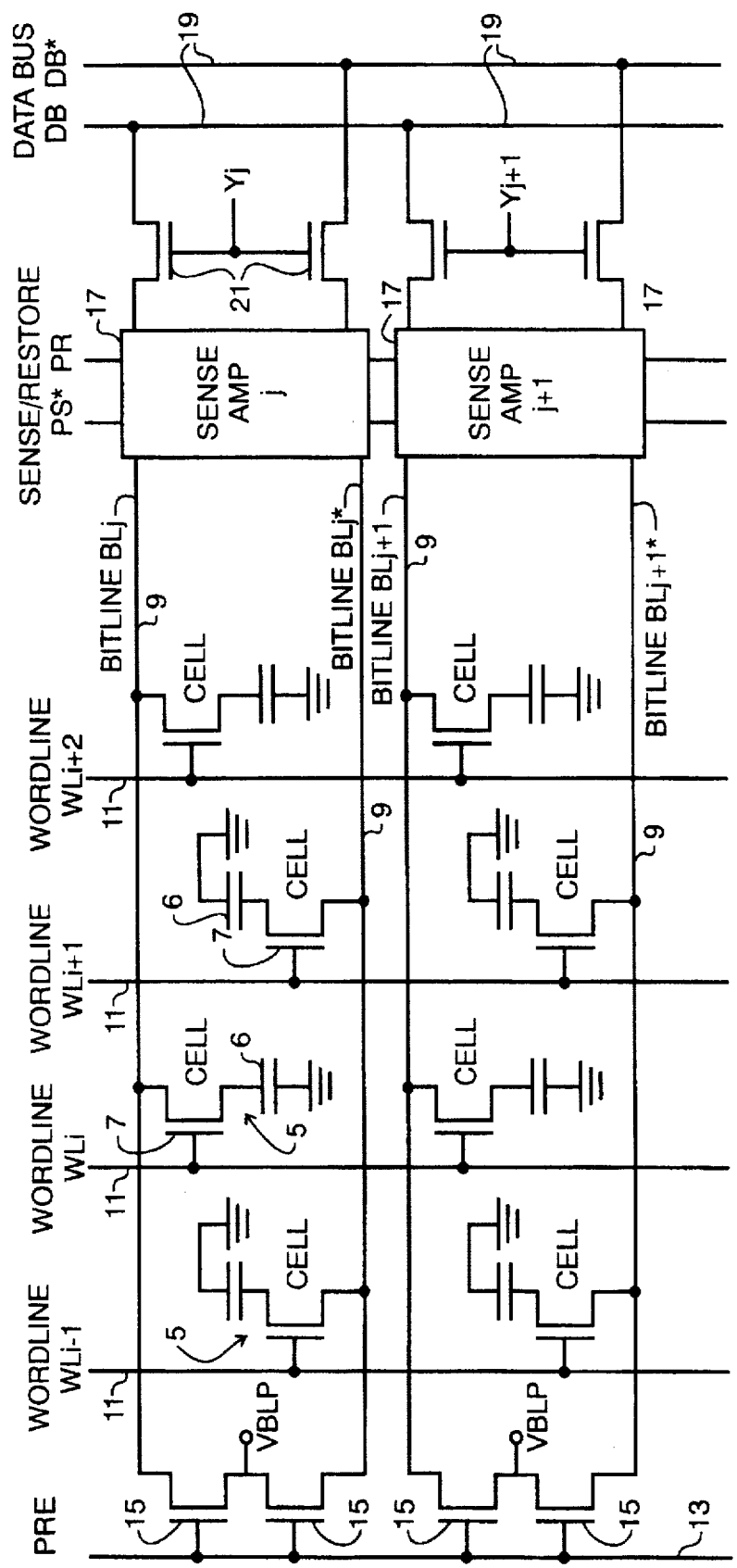
FIG. 2 is a schematic diagram of a DRAM.

FIG. 2 illustrates a portion of a memory bank in more detail. Memory cells 5 are each comprised of a charge storage capacitor 6 and an access FET 7. The embodiment shown also includes a folded bitline 9, the conductors of which are also labeled BLj, BLj*, BLj+1 and BLj+1*. It should be noted, however, that the present invention can equally be implemented using an open bitline architecture.

Wordlines 11 run orthogonally to the bitlines, and are labeled WLi−1, WLi, WLi+1 and WLi+2 respectively. The gates of each row of access FETs 7 are connected to a corresponding wordline.

A precharge enable line 13 is connected to the gates of bitline precharge transistors 15 whose source-drain circuits are connected between a bitline precharge voltage source Vblp and respective conductors of the bitline. A bitline sense amplifier 17 is connected between each bitline 9 and databus lines 19, also labeled DB and DB*. Column access FETs 21 have their source-drain circuits connected between the sense amplifiers and the databus lines 19. FETs 21 are addressed by address lines Yj, Yj+1, thus providing a column address to the DRAM.

As is well known, prior to reading from or writing to the cells 5, the bitline is charged to Vdd/2 and the wordlines are precharged to Vss. In a reading cycle, the access FETs are then enabled by raising the wordline to Vdd or Vpp=Vdd+Vtn causing the capacitors 7 to dump their charges to their respective bitlines. The bitlines are then sensed, raising the voltage of the bitlines to full logic level Vdd or Vss in a well known manner. Upon column addressing FETs 21, the sensed logic level is transferred to the databus lines 19.

In accordance with an embodiment of the invention, the wordlines are programmed to selectively cause either one or more than one cell access FET to be enabled, in the latter case thus storing a bit as opposite logic level bits in a pair of charge storage capacitors, each associated with a different wordline. The same DRAM can thus be programmed to greater data integrity in which plural capacitors store a bit, or maximum DRAM capacity in which only one capacitor associated with a wordline stores the data bit present on the bitline.

Figure 3:
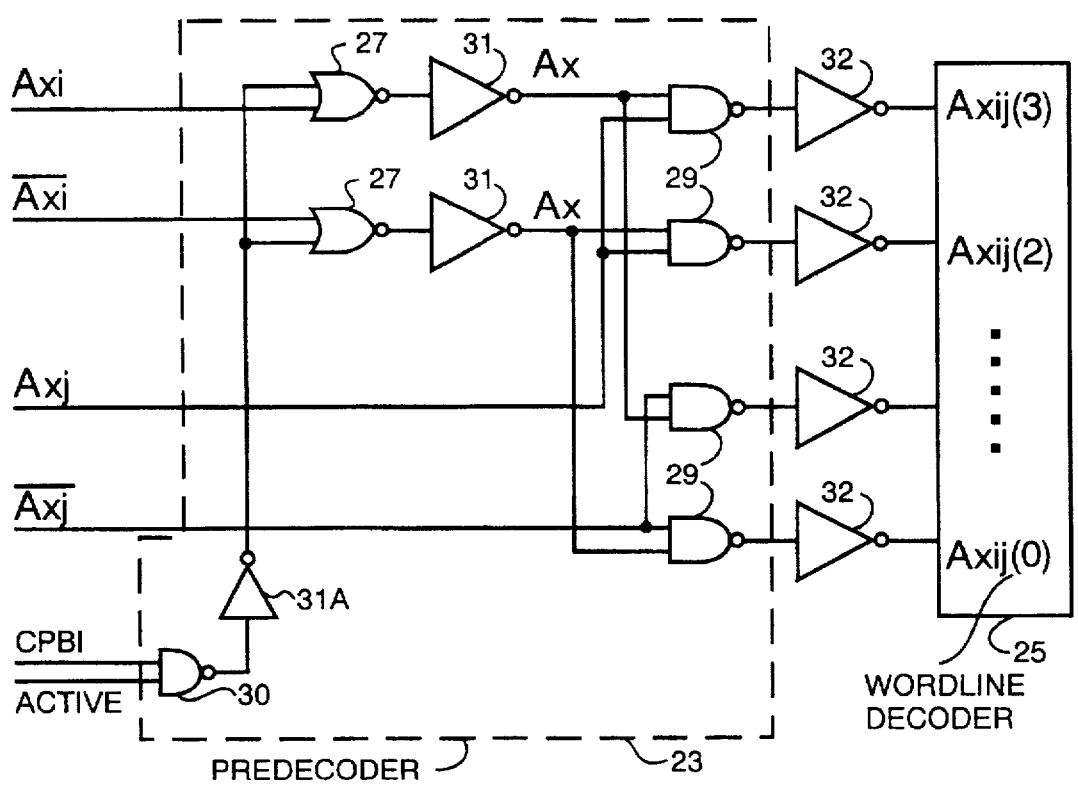
FIG. 3 is a partly logic and partly block diagram of an embodiment of the invention.
Figure 6:
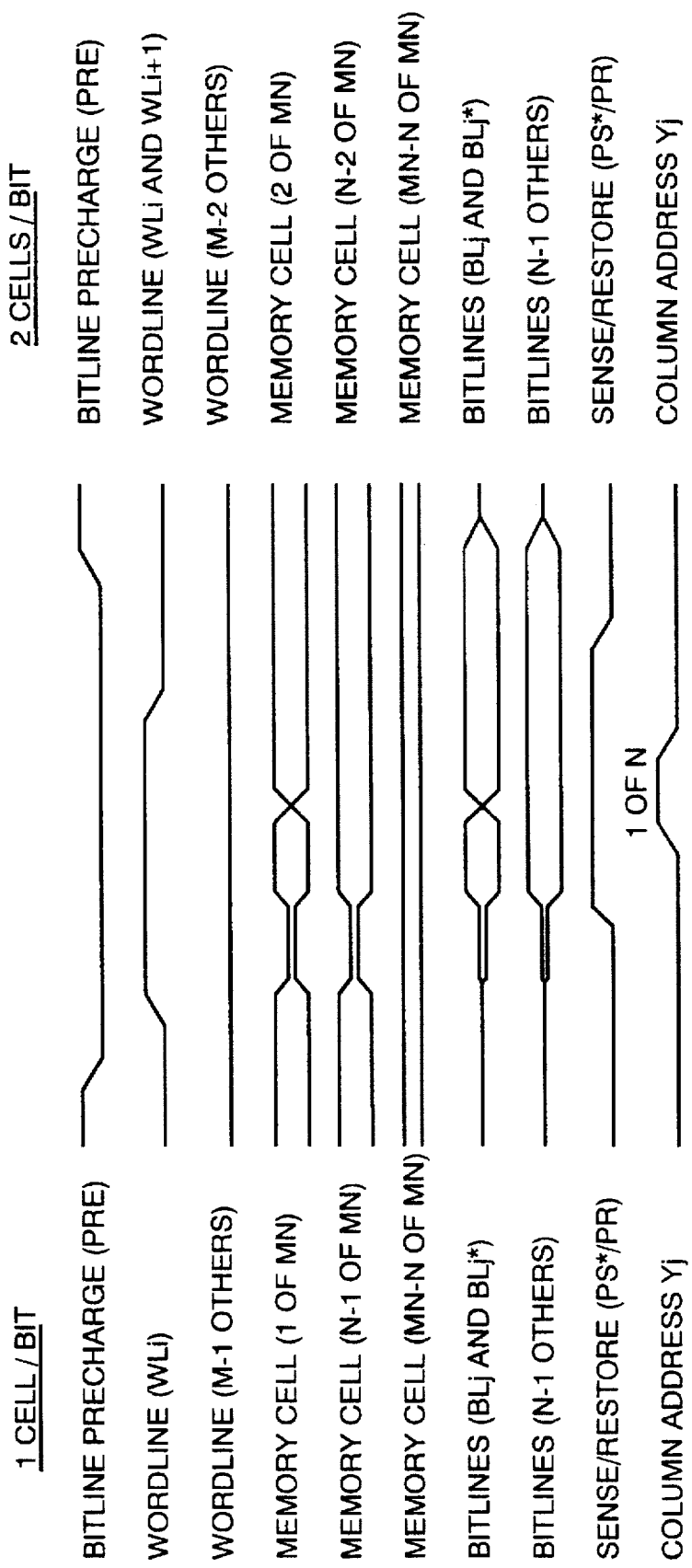
FIG. 6 is a timing diagram of the various voltages in the DRAM cell array, for storage of both one cell per bit and 2 cells per bit.

This is achievable with the circuit as illustrated in FIG. 3 and the voltage timing diagram of FIG. 6. A predecoder 23 receives representative wordline address signals AXi, /AXi, AXj and /AXj signals and provides output signals to a wordline decoder 25. The least significant wordline address signals are applied to respective inputs of NOR gates 27. The output signals of NOR gates 27 are applied to inputs of NAND gates 29 through inverters 31. The inputs of NAND gates 29 are interconnected as illustrated so as to provide truth table outputs AXij(0), AXij(1), AXij(2) and AXij(3) as shown in FIG. 4, Table 1 for the inputs AXi/AXi, AXj and/AXj in the first four rows of the table, which is the active mode.

A NAND gate 30 has its inputs connected to a CPB signal and to an ACTIVE signal. Its output is connected through an inverter 31A to each other input of NOR gates 27. The outputs of NAND gates 29 are connected to the inputs (labelled as the aforenoted truth table outputs) of decoder 25 through inverters 32.

In operation, when the logic signal CPB is 0, any ACTIVE input is overridden, and there is no input signal from NAND gate 30 applied to NOR gates 27. Thus the wordline address signals (X address) applied to NOR gates 27 pass through, and are predecoded normally by NAND gates 29. The resulting predecoded address signal is applied to wordline decoder 25 for decoding and addressing the wordlines of the DRAM in the normal manner, as one bit per charge storage cell 5. The result, for writing, or reciprocally for reading, is that each bit is stored in a single cell capacitor 6.

The truth table states for this situation are shown in the last row, labeled STANDBY.

However, when the logic signal CPB is 1, logic signals on the ACTIVE line can be applied to NOR gates 27, overriding zeros applied thereto from the least significant wordline address input lines if the address signals applied to NOR gates 27 are ones. In this case logic signals on the ACTIVE line can be as shown in FIG. 5, Table 2. In this case, the ACTIVE line being high causes input logic signals on the input lines to result in, in the embodiment shown, two wordline address lines at a time to the NAND gates 29 being enabled, e.g. AXij(0) and AXij(1) or AX01(2) and AX01(3). In the STANDBY mode, when the CPB signal is 0, with the ACTIVE input signal being low (0), the input address signals of 0 result in 0 address signals to the NAND gates 29.

In the above manner, two wordline addresses, and two adjacent wordlines, are simultaneously activated to access one FET on each of two complementary bitlines. Data is written either as a "0" (Vss level in the cell connected to the BLj bitline conductor, and Vdd or Vdd—Vtn connected to the BLj* bitline conductor), or as a "1" (Vss level in the cell connected to BLj* and Vdd or Vdd–Vtn connected to BLj.

Since two wordlines are addressed at a time, the least significant row address becomes a "don't care" input.

FIG. 7 is a block diagram illustrating another embodiment of the invention, which may be used either separately or in conjunction with the first described embodiment. It is an object of this embodiment to provide for programming of the ability to use either a boosted voltage Vpp or an unboosted voltage Vdd as a wordline voltage.

In FIG. 7, the Vpp level on the Vpp line 33 is detected in Vpp level detector 35, and if it is lower than a predetermined threshold, a resulting oscillator output signal is applied to an input of an oscillator 37. Oscillator 37 also receives a VppEN signal, which is a program enable signal that is required by the oscillator before it will begin oscillating.

With reference also to the timing diagram illustrated in FIG. 8, a square wave output signal OSC./OSC is output from oscillator 37, and is applied to level shifter 39. Level shifter 39 shifts the logic level of the OSC and/OSC signals to the Vpp value, supplying output signals OSC+ and/OSC+. Those signals and the OSC./OSC signals are applied to a voltage pump 41, where an input voltage Vdd is boosted by the pump to the boosted voltage Vpp, preferably equal to Vdd+Vtn, and is applied to the Vpp line 33.

The Vpp level is used in a wordline driver circuit such as the one shown in FIG. 1 of U.S. Pat. No. 5,214,602 issued May 25, 1993, and assigned to the same assignee as this patent application, and is incorporated herein by reference. The circuit is comprised of a final decoder NAND gate, a level shifter, and a p-channel wordline driver.

For least voltage stress on the DRAM, the application program does not provide the signal VppEN to the oscillator 37. As a result there is no signal applied to the pump, and Vdd is applied to the Vpp line via the pump 41. The voltage on the Vpp line 33 is applied to the wordline as described in the aforenoted patent. As a result, the voltage seen by the memory cell will be Vdd-Vtn due to the drop across the NMOs access FET. As indicated earlier, this voltage value may result in loss of some data from time to time, which may be satisfactory for certain audio and video applications.

FIG. 9 is a logic diagram of the Vpp voltage level detector 35 and the oscillator 37. FETs 46 and 47 have their sources connected to the Vpp line, and their gates connected together and to the drain of FET 47. Another FET 48 has its drain connected to the drain of FET 47, its source to Vdd and its gate to Vpp. FET 49 has its drain connected to the drain of FET 46 and its source to ground (Vss), and its gate to Vdd. FET 49 is fabricated as a long device so as to act as a resistor. The output of the Vpp voltage level detector 35 is the junction of the drains of FETs 46 and 49, which is applied via inverter 50 to one input of NAND gate 51 of oscillator 37.

The output of NAND gate 51 is a signal OSC, which is applied through inverter 52 to provide the signal/OSC. The output of inverter 52 is connected through three inverters connected in series to another input of NAND gate 51. The VppEN program signal is applied to a third input of NAND gate 51.

In operation, the gate of FET 48 receives Vpp and enables FET 48 if it is at least Vtn above Vdd in voltage. As a result FET 46 is enabled, drawing current from the Vpp line through FET 49 to ground. FETs 46 and 49 operate as a voltage divider, establishing a voltage level at the input of inverter 50 which is either close to Vpp, if FET 46 is enabled, or close to ground (Vss), if FET 46 is not enabled. The resulting input to NAND gate 51 from the output of inverter 50 is a logic signal.

With a VppEN program logic signal input to NAND gate 51 high, and with its third input high, a high logic signal is output from NAND gate 51, which is output as OSC, and the inverse logic is output as /OSC. This is passed through inverters 53 and applied to the third input of NAND gate 51, which reverses logic level. The cycle carries on with respectively opposite logic levels applied to the third input to NAND gate 51, resulting in a continuous stream of rectangular pulses, as shown in FIG. 8, /OSC being slightly behind OSC due to the time to pass through inverter 52.

These signals are applied to the gates of FETs 55 and 56 of the level shifter 39, shown in FIG. 10, whose sources are connected to ground. The drains of these FETs are connected to the sources of respective FETs 57 and 58, whose gates are connected together and to Vdd. The drains of FETs 57 and 58 are connected to the drains of cross coupled FETs 59 and 60, whose sources are connected to the Vpp line 33. Output signals OSC+ and/OSC+ are provided from the drains of cross coupled FETs 59 and 60. The timing of these output signals may be seen from the timing diagram FIG. 8.

The signals OSC and /OSC+ are applied to the inputs of Vpp powered NAND gate 60, whose output is connected to the gate of FET 62. The OSC signal is applied to an input of NOR gate 64, and the/OSC+ signal is applied to the other input of NOR gate 64 through an inverter 66. The output of NOR gate 64 is applied to the gate of FET 68.

The source of n-channel FET 62 is connected to Vdd and its drain is connected to the drain of n-channel FET 69. The gate of FET 69 is held at Vdd to serve as a hot electron protection device for FET 68. The source of FET 69 is connected to the drain of FET 68, the source of which is connected to ground.

The source of an FET 70 is connected to the Vpp line 33, and its drain is connected to the drain of an FET 71 whose source is connected to Vdd. The gate of FET 71 is connected to the output of NAND gate 60 and the signal/OSC+ is applied to the gate of FET 70.

In operation, alternate signals OSC and/OSC cause flip flop operation of cross coupled FETs 59 and 60, resulting in higher voltage (raised from Vdd applied to the gates of FETs 57 and 58) rectangular output signals OSC+ and/OSC+.

While OSC=0, n-channel FETs 68 and 71 are enabled to charge up capacitor 73. When OSC=1 the negative plate of capacitor 73 is raised from Vss to Vdd as p-channel FET 62 turns on, and p-channel FET 70 is enabled to dump charge onto the Vpp line 33.

FIG. 11 illustrates a circuit which can create a lower bitline precharge voltage for when Vpp is not enabled, to accommodate '1' level in storage cells.

FET 75 has its source connected to Vpp and its gate connected to ground. Its drain is connected to the source of FET 76 which has its source-drain circuit bypassed by an FET 77 of opposite conductivity type than FET 76, having its gate and drain connected to the source of FET 76 and its source connected to the drain of FET 76. FET 77 thus acts as a diode across the source-drain of FET 76. The drain of FET 76 is connected to the drain and gate of FET 78 (of similar polarity as FET 77) whose source is connected to the source of FET 79. The gate and drain of FET 79 are connected to the drain of FET 80 which is also similar conductivity type as FET 77. The gate of FET 80 is connected to Vpp and the source is connected to ground.

The gate of FET 81 is connected to the drain of FET 78, its drain is connected to Vdd and its source is connected to the source of FET 82. The gate of FET 82 is connected to the drain of FET 79 and its drain is connected to ground.

The input to the circuit at which the signal /VppEN is applied is the gate of FET 76, and the output of the circuit, which is the bitline precharge voltage PRE, is at the junction of the sources of FETs 81 and 82. The PRE lead is connected the PRE lead 13 shown in FIG. 2.

In operation, when/VppEN=0, FETs 81 and 82 conduct between Vdd and ground, the output PRE voltage is (Vdd–Vtn)/2, where Vtn is the threshold of conductive of an FET.

When /VppEN=1, the FET string from Vpp to ground conducts, FET 82 is cut off, and the voltage PRE is raised to Vpp/2 due to the point of connection of the gate of FET 81 at a Vpp splitting point which is Vpp/2.

FIG. 12 is a circuit that ties Vpp to Vdd when the voltage pump 41 is disabled. FET 83 has its gate and drain connected to the Vdd line and its source to the Vpp line. FET 83 thus acts as a clamp.

A level shifter 84 is comprised of a pair of cross coupled FETs 85 having their mutual sources connected to the Vpp line, one drain connected to the drain of FET 86 and the other drain of the cross coupled FETs connected to the drain of FET 87. The sources of FETs 86 and 87 are connected to ground.

The Vpp enable signal /VppEN is applied to the gates of FET 86 and the /VppEN signal is applied to the gate of FET 87.

The junction of the drain of FET 87 and cross coupled FETs 85 is connected to the gate of FET 88, whose well is connected to the sources and the wells of FETs 89 and 90. The source of FET 88, the drain of FET 89 and the gate of FET 90 are connected to the Vpp line and the drains of FETs 89 and 90 and the gate of FET 89 are connected to the Vdd line.

The cross coupled FETs 89 and 90 keep the well of FET 88 at the higher of either Vpp or Vdd. When FET 88 is enabled, i.e. when VppEN=0 and /VppEN=0, FET 88 is turned on and acts as a shorting device, forcing the Vpp line to Vdd.

Thus when /VppEN=1, the pump is disabled, and the Vpp line reverts to the voltage Vdd.

While the aforenoted description has been of embodiments using n-channel memory cell access transistors, the circuitry can be inverted wherein p-channel memory cell access FETs are used, and Vpp=Vss−Vtp, wherein Vtp is a p-channel FET conductive threshold voltage. In this case the wordline voltage can be either Vss or Vpp, depending on whether Vpp is enabled.

If the application wishes to have high reliability of data, for example for computational situations, the programming logic signal VppEN=1 should be applied to the oscillator 37. As a result, the voltage Vpp will be produced by pump 41, which preferably is Vdd+Vtn. In this case however, there will be a higher voltage stress on the DRAM, which could as a result of some fabrication processes result in shorter lifetime of the DRAM.

In case highest reliability of data is desired, both the boosted wordline voltage Vpp and plural cell storage per bit embodiments should be used together, in the latter case both the program logic signals VppEN=1 and CPB=1 should be used. As noted in table A, four separate programming conditions may be utilized for usage of one or plural cells for storage of a single bit and for use of normal or boosted wordline precharge voltage.

A person understanding this invention may now conceive of alternative structures and embodiments or variations of the above. All of those which fall within the scope of the claims appended hereto are considered to be part of the present invention.

I claim:

1. A method of storing data in a DRAM array comprised of cells coupled to complementary bitline pairs, comprising:
   (a) programming said DRAM to determine whether each bit of a plurality of bits should be stored in one cell or as opposite logic level bits in a pair of cells of said DRAM,
   (b) applying each bit and its complement to a respective bitline pair of said DRAM,
   (c) activating a wordline and storing said bit associated with said wordline in one cell or activating a pair of wordlines and storing said bit and its complement in said pair of cells, depending on said programming.

2. A method of storing data in a DRAM array as defined in claim 1, comprising providing an unboosted wordline voltage Vdd and a boosted wordline voltage Vpp and selectably programming application of either of said voltages to a wordline prior to reading or writing of a bit to a charge storage cell associated with said wordline.

3. A method as defined in claim 2 in which said boosted wordline voltage Vpp is substantially equal to Vdd+Vtn, where Vtn is an n-channel field effect transistor (FET) conduction threshold.

4. A method as defined in claim 3 in which said boosted wordline voltage Vpp is generated by pumping up the normal wordline precharge voltage Vdd.

5. A method of storing data in a DRAM array as defined in claim 1, comprising providing an unboosted wordline voltage Vss and a boosted wordline precharge voltage Vpp and selectably programing application of either of said voltages to a wordline prior to reading or writing of a bit to a charge storage cell associated with said wordline.

6. A method as defined in claim 5 in which said boosted wordline voltage Vpp is substantially equal to Vss−Vtp, where Vtp is a p-channel field effect transistor (FET) conduction threshold.

7. A method as defined in claim 6 in which said boosted wordline voltage Vpp is generated by pumping down the normal wordline precharge voltage Vss.

8. A DRAM array comprising:
   (a) plural wordlines and plural bitlines,
   (b) bit charge storage capacitors associated with the bitlines and wordlines,
   (c) cell access field effect transistors (FETs) having their gates connected to the wordlines and their source-drain circuits connected between the bitlines and the charge storage cells, for enabling reading or writing data from or to the charge storage capacitors,
   (d) programmable addressing means for causing the wordlines, once addressed, to selectively enable either one or more than one cell access FET, whereby data can be selectively read from or written to one or more than one charge storage capacitor,
   (e) a boosted wordline voltage source, and
   (f) means for selectably connecting said boosted voltage source or an unboosted precharge voltage source to said wordlines, whereby said DRAM array can be operated selectably with or without a boosted wordline precharge voltage.

9. A DRAM array as defined in claim 8 in which said boosted wordline voltage source is comprised of a boosted voltage conductor, means connected to said conductor for detecting a level of said boosted voltage, an oscillator enabled by said detecting means, a level shifter for increasing the output voltage of said oscillator by a predetermined amount, and a pump for receiving an unboosted wordline voltage, the output voltage of the oscillator and the increased output voltage of the oscillator and increasing the unboosted wordline voltage and applying a resulting voltage to the conductor.

10. A DRAM as defined in claim 9, in which the output of the pump is substantially equal to the unboosted wordline voltage Vdd plus a field effect transistor (FET) conduction threshold voltage Vtn.

* * * * *